United States Patent
Segawa et al.

(10) Patent No.: US 6,724,011 B2
(45) Date of Patent: *Apr. 20, 2004

(54) DISPLAY DEVICE

(75) Inventors: Yasuo Segawa, Gifu (JP); Keiichi Sano, Gifu (JP); Kazuto Noritake, Gifu (JP)

(73) Assignee: Sanyo Electric Co., Ltd. (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/518,321

(22) Filed: Mar. 3, 2000

(65) Prior Publication Data
US 2002/0195604 A1 Dec. 26, 2002

(30) Foreign Application Priority Data
Mar. 5, 1999 (JP) .......................... 11-058742

(51) Int. Cl.⁷ .................................. H01L 29/04
(52) U.S. Cl. ............... 257/72; 257/59; 257/350
(58) Field of Search ................... 257/72, 40, 57, 257/59, 60, 67, 350

(56) References Cited
U.S. PATENT DOCUMENTS

| | | | |
|---|---|---|---|
| 5,548,153 A | * | 8/1996 | Muragishi ................. 257/365 |
| 5,550,066 A | * | 8/1996 | Tang et al. ................. 438/29 |
| 5,644,146 A | * | 7/1997 | Arai et al. ................. 257/66 |
| 5,702,963 A | * | 12/1997 | Vu et al. ................. 437/41 |
| 5,754,261 A | * | 5/1998 | Lyu ................. 349/44 |
| 5,796,116 A | * | 8/1998 | Nakata et al. ................. 257/66 |
| 5,834,797 A | * | 11/1998 | Yamanaka ................. 257/57 |
| 5,955,765 A | * | 9/1999 | Yamazaki et al. ................. 257/365 |
| 5,965,916 A | * | 10/1999 | Chen ................. 257/347 |
| 5,966,193 A | * | 10/1999 | Zhang et al. ................. 349/110 |
| 6,034,747 A | * | 3/2000 | Tanaka et al. ................. 349/43 |
| 6,100,954 A | * | 8/2000 | Kim et al. ................. 349/138 |
| 6,252,248 B1 | * | 6/2001 | Sano et al. ................. 257/59 |

* cited by examiner

Primary Examiner—George Eckert
Assistant Examiner—N. Drew Richards
(74) Attorney, Agent, or Firm—Fish & Richardson P.C.

(57) ABSTRACT

A display device in which variations of characteristics of a TFT are eliminated and the aperture ratio is improved is provided. A display device has a thin film transistor on an insulating substrate 10. The thin film transistor includes first gate electrodes 11, a gate insulating film 12, a semiconductor film 13 which is formed on the first gate electrode 11, and a interlayer insulating film 15. The thin film transistor further includes second gate electrodes 70 which are on the interlayer insulating film 15 and at least above channels 13c, and which are connected to the first gate electrodes 11. A reflective display electrode 19 connected to the source of the thin film transistor is elongated to extend above the thin film transistor.

24 Claims, 6 Drawing Sheets

DISPLAY DEVICE

This is a continued prosecution application of U.S. patent application No. 09/518,321, filed Mar. 3, 2000, which in turn claims the benefit of Japanese Application No. Hei. 11-058742, filed Mar. 5, 1999.

BACKGROUND OF THE INVENTION

1. Field of the Invention

The present invention relates to a display device in which a thin film transistor (hereinafter, abbreviated as "TFT") is used as a switching element.

2. Description of the Related Art

Recently, a TFT in which a polycrystalline silicon film is used as an active layer is being developed as a driver element or a pixel driver element for various kinds of display devices such as an active-matrix liquid crystal display device (hereinafter, abbreviated as "LCD").

Hereinafter, a reflection type LCD having conventional TFTs will be described. A reflection type liquid crystal display device is a display device in which light entering from the side of the viewer is reflected by a reflective display electrode so as to enable a display to be viewed.

FIG. 8 is a plan view of a TFT of a display pixel portion of the conventional art, and FIG. 9 is a section view of an LCD using a TFT and taken along the line E—E in FIG. 8.

As shown in FIG. 8, a TFT of a display pixel portion is disposed in the vicinity of an intersection of a gate signal line 51 through which a gate signal is supplied, and a drain signal line 52 through which a video signal is supplied. The source 13s of the TFT is connected to a reflective display electrode 19. The reflective display electrode 19 is not formed on the TFT.

Referring to FIG. 9, the structures of the TFT and the LCD will be described.

Gate electrodes 11 made of a refractory metal such as chromium (Cr) or molybdenum (Mo), a gate insulating film 12, and an active layer 13 configured by a poly-silicon film are sequentially formed on an insulative substrate 10 which is made of quartz glass, non-alkali glass, or the like.

In the active layer 13, disposed are channels 13c above the gate electrodes 11, and a source 13s and a drain 13d which are respectively formed on both sides of the channels 13c by ion implantation using stopper insulating films 14 on the channels 13c as a mask.

A interlayer insulating film 15 in which an SiO$_2$ film, an SiN film, and an SiO$_2$ film are laminated is formed over the whole face of the gate insulating film 12, the active layer 13, and the stopper insulating film 14. A drain electrode 16 is formed by filling a metal such as Al into a contact hole which is opened correspondingly with the drain 13d. A planarizing insulating film 17 which is made of an organic resin or the like and which planarizes the surface is formed over the whole face. In the planarizing insulating film 17 and the interlayer insulating film 15, a contact hole is opened at a position corresponding to the source 13s. A reflective display electrode 19 which is made of a reflective material such as Al and contacted with the source 13s via the contact hole is formed on the planarizing insulating film 17. An alignment film 20 which is made of an organic resin such as polyimide and which is used for aligning a liquid crystal 21 is formed on the reflective display electrode 19. At this time, the reflective display electrode 19 is not formed on the TFT.

The insulative substrate 10 having TFTs which have been produced as described above, and a counter electrode substrate 30 having a counter electrode 31 and an alignment film 32 which are opposed to the substrate 10 are bonded in periphery together by a sealing adhesive agent 23. The liquid crystal 21 is filled into a gap formed between the substrates. Polarizing plates 33 are respectively applied to the outsides of the substrates 10 and 30, thereby completing the LCD.

FIG. 10 shows characteristics of the TFT. The abscissa indicates the gate voltage Vgs, and the ordinate indicates the drain current Ids.

Since the reflective display electrode 19 does not exist above the channels of the TFT, the TFT exhibits characteristics in which, as indicated by the solid line in FIG. 10, the off-state current does not flow when the gate voltage Vgs is 0 V. By contrast, in the case where the reflective display electrode is formed so as to cover also the whole face of the TFT, the characteristics are changed as indicated by the broken line in FIG. 10.

This is caused by the following reason. A voltage is applied to the reflective display electrode 19 disposed above the channels 13c. Charges are generated by an electric field due to the voltage, and so-called back channels are generated with respect to the channels 13c.

When such a TFT is used in an LCD, the reflective display electrode may be elongated to extend above the TFT in order to improve the aperture ratio. This causes the threshold voltage to be changed in a decreasing direction, and hence the off-state current is increased as shown in FIG. 10. As a result, there arise drawbacks that a bright defect in which a pixel is always bright, or an unlit defect in which a pixel is always unlit occurs and an excellent display cannot be obtained, and that the threshold voltages is varied among TFTs and a display which is uniform in brightness over the screen cannot be obtained.

The invention has been conducted in view of the drawbacks of the conventional art. It is an object of the invention to provide a display device in which a TFT is shielded against an electric field caused by a pixel electrode above the TFT to stabilize the threshold voltage of the TFT, thereby enabling a display in which defects such as a bright defect are reduced, brightness is uniform over the screen, and the aperture ratio is improved.

SUMMARY OF THE INVENTION

In the display device of the invention, for example, a thin film transistor is disposed on an insulative substrate, the thin film transistor comprises: a first gate electrode; a first insulating film; a semiconductor film which is formed on the first gate electrode and which has a channel; a second insulating film; and a second gate electrode which is formed on the second insulating film and at least above the channel, and which is connected to the first gate electrode, wherein a display electrode connected to a source which is formed in the semiconductor film is elongated to extend above the thin film transistor.

Namely a first aspect of the device is a display device in which a thin film transistor is disposed on an insulative substrate, said thin film transistor comprising: a first gate electrode; a gate insulating film; a semiconductor film which is formed on said gate insulating film and which has a channel; a insulating film; and a display electrode connected to a source which is formed in said semiconductor film is elongated so as to extend above said channel of said thin film transistor, wherein a second gate electrode being at a constant potential, which is formed between said first gate electrode and said display electrode.

A second aspect of the device is a display device according to the first aspect, wherein said second gate electrode is connected with said first gate electrode.

A third aspect of the device is a display device according to the second aspect, wherein said second gate electrode is formed so as to be faced with said first gate electrode through said insulating film.

A fourth aspect of the device is a display device according to the third aspect, wherein said display electrode is rectangular.

A fifth aspect of the device is a display device according to the third aspect, wherein said channel is covered with a stopper insulating film.

A sixth aspect of the device is a display device according to the fifth aspect, wherein said stopper insulating film is made of an $SiO_2$ film.

A seventh aspect of the device is a display device according to the fifth aspect, wherein said stopper insulating film is made of a two-layered film of SiN and organic film.

An eighth aspect of the device is a display device according to the first aspect, wherein said first gate electrode is a double gate structured electrode divided above the channel.

A ninth aspect of the device is a display device according to the eighth aspect, wherein said second gate electrode is a double gate structured electrode divided corresponding to said first gate electrode.

A tenth aspect of the device is a display device according to the ninth aspect, wherein said display electrode is a reflective display electrode which is made of a reflective material.

An eleventh aspect of the device is a display device according to the tenth aspect, wherein said reflective display electrode is made of Al—Nd alloy.

A twelfth aspect of the device is a display device according to the first aspect, wherein said display electrode is an electrode used in a liquid display device.

A third aspect of the device is a display device according to the first aspect, wherein said display electrode is an electrode used in an organic electro luminescent(EL) device.

In the invention, the display electrode is a reflective display electrode which is made of a reflective material.

DETAILED DESCRIPTION OF THE INVENTION

Hereinafter, the display device of the invention will be described.

<First Embodiment>

Figure 1:
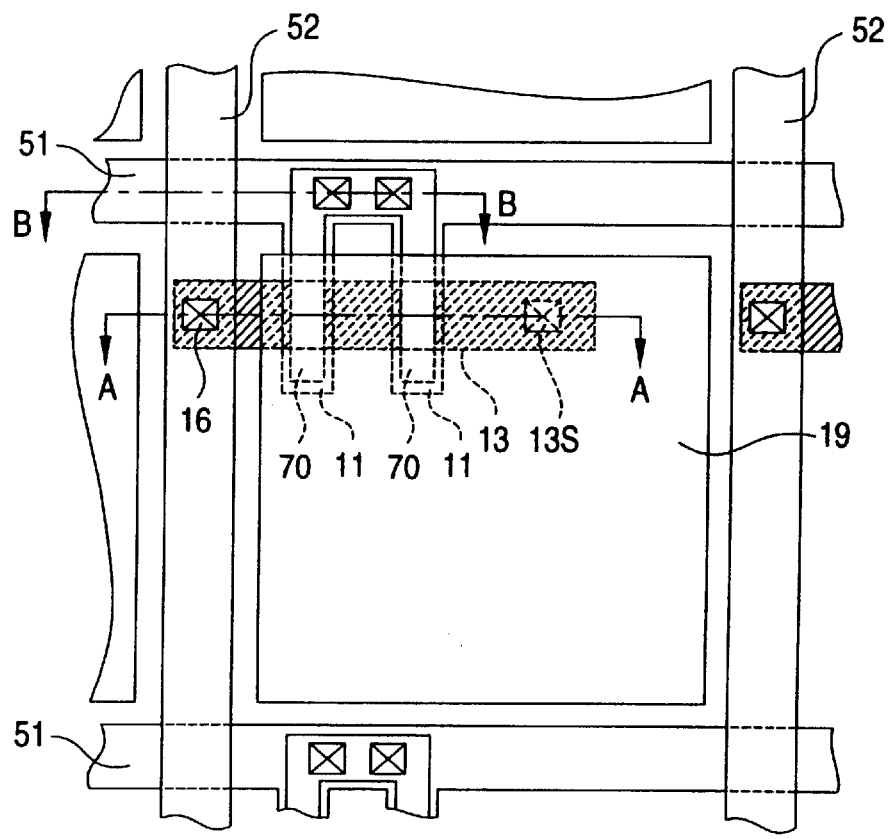
FIG. 1 is a plan view of an LCD of a first embodiment of the invention.
Figure 2:
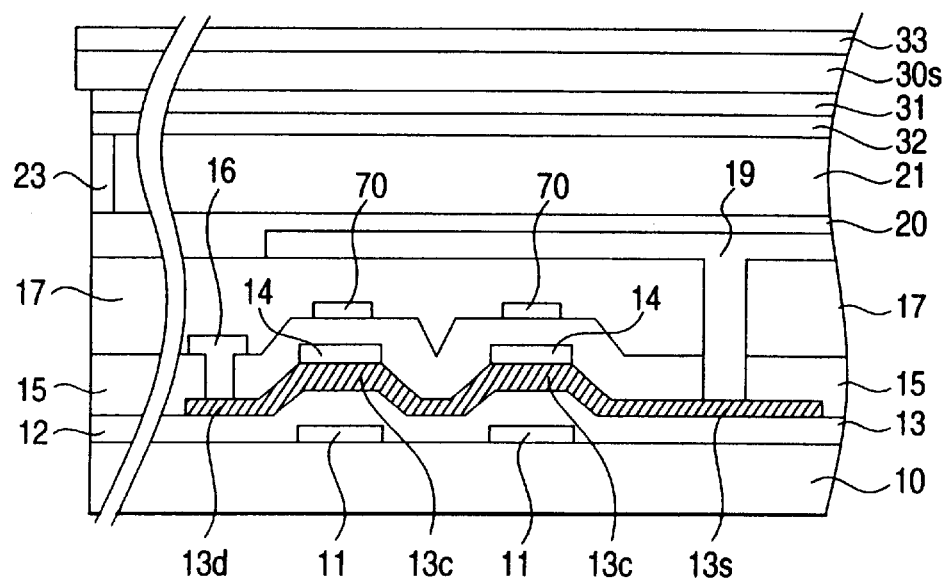
FIG. 2 is a section view of the LCD of the first embodiment of the invention.
Figure 3:
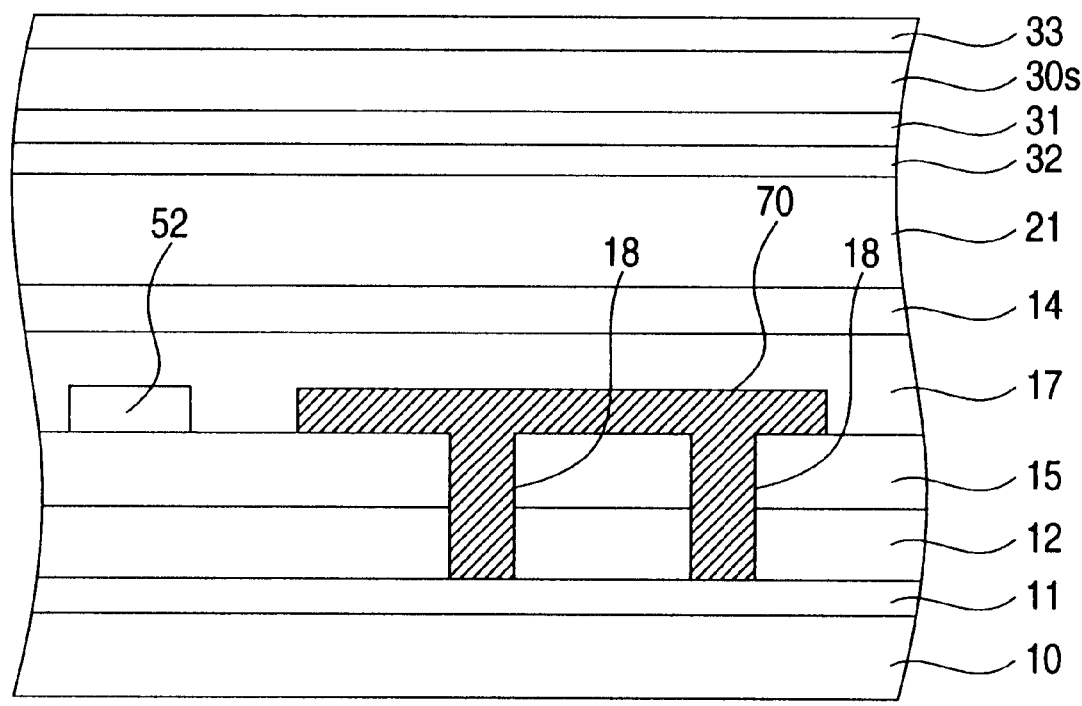
FIG. 3 is a section view of the LCD of the first embodiment of the invention.

FIG. 1 is a plan view of a display pixel portion according to the invention, FIG. 2 is a section view of an LCD taken along the line A—A of FIG. 1, and FIG. 3 is a section view taken along the line B—B of FIG. 1.

As shown in FIG. 1, a TFT to which a reflective display electrode 19 made of a reflective material is connected is disposed in the vicinity of an intersection of a gate signal line 51 a part of which serves as first gate electrodes 11, and a drain signal line 52 a part of which serves as a drain electrode 16. The reflective display electrode 19 is elongated to extend above the TFT.

As shown in FIG. 2, the first gate electrodes 11 made of a refractory metal such as Cr or Mo, a gate insulating film 12 configured by an SiN film and an $SiO_2$ film, and an active layer 13 configured by a poly-silicon film are sequentially formed on an insulative substrate 10 which is made of quartz glass, non-alkali glass, or the like.

In the active layer 13, disposed are channels 13c above the gate electrodes 11, and a source 13s and a drain 13d which are respectively formed on both sides of the channels 13c by ion implantation.

A stopper insulating film 14 is disposed on the channels 13c. The stopper insulating film is configured by an $SiO_2$ film serving as a mask which covers the channels 13c so as to prevent ions from entering the channels 13c during a process of forming the source 13s and the drain 13d.

An interlayer insulating film 15 in which an $SiO_2$ film, an SiN film, and an $SiO_2$ film are laminated is formed over the whole face of the gate insulating film 12, the active layer 13, and the stopper insulating film 14. The interlayer insulating film 15 is configured by a single organic film made of SiO, SiN, or an organic material such as an acrylic resin, or by a multilayer member consisting of any combination of these materials.

The drain electrode 16 is formed by filling a metal consisting of, for example, Al only, or a laminated member of Mo and Al, into a contact hole which is opened in the interlayer insulating film 15 at a position corresponding to the drain 13d. Simultaneously with the formation of the drain electrode 16, second gate electrodes 70 are formed on the interlayer insulating film 15 and above the channels 13c. In other words, the second gate electrodes 70 made of a metal consisting of, for example, Al only, or a laminated member of Mo and Al are formed.

As shown in FIG. 3, the second gate electrodes 70 disposed on the interlayer insulating film 15 are connected to the gate signal line 51 on the insulative substrate 10 via contact holes 18 which are opened in the gate insulating film 12 and the interlayer insulating film 15. The drain signal line 52 is disposed on the interlayer insulating film 15. A planarizing insulating film 17 which is made of an organic resin or the like is then formed over the whole face.

As shown in FIG. 2, a contact hole is opened in the planarizing insulating film 17 at a position corresponding to the source 13s, and the reflective display electrode 19 which serves also as a source electrode is formed. The reflective display electrode is made of an electrically conductive reflective material such as Al and contacted with the source 13s. An alignment film 20 which is used for aligning a liquid crystal 21 is formed on the reflective display electrode.

The insulative substrate 10 having TFTs which have been produced as described above, and a counter electrode substrate 30s having a counter electrode 31 and an alignment film 32 which are opposed to the substrate 10 are bonded in periphery together by a sealing adhesive agent 23. The liquid crystal 21 is filled into a gap formed between the substrates, thereby completing the LCD.

As described above, the second gate electrodes 70 which are connected to the first gate electrodes 11 and formed above the channels 13c are disposed, and the reflective display electrode 19 is elongated to extend above the TFT. Therefore, impurities are prevented from adhering to the surface of the interlayer insulating film, whereby charges are prevented from accumulating into the surface of the interlayer insulating film. Furthermore, a TFT of a stable threshold voltage can be obtained, a display in which a defects such as a bright defect are reduced and which is uniform in brightness over the screen can be obtained, and an LCD of a high aperture ratio can be obtained.

Figure 7:
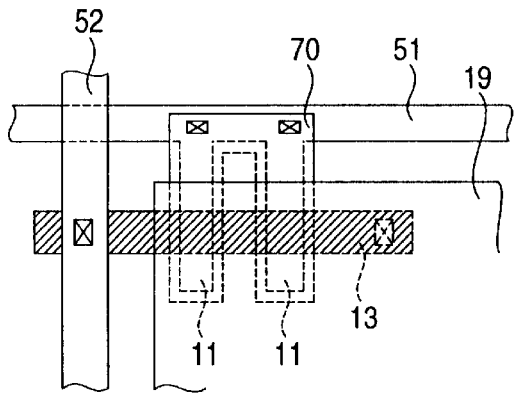
FIG. 7 is a partial plan view of a TFT of the second embodiment of the invention.
Figure 7:
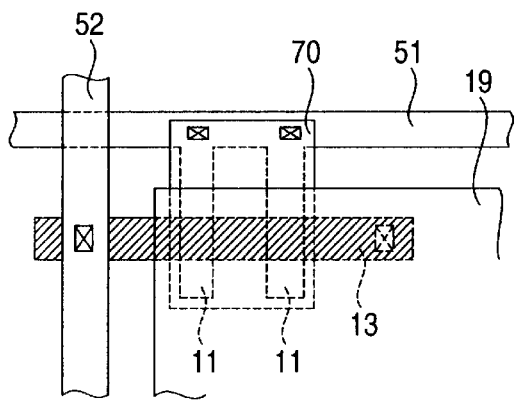
Figure 8:
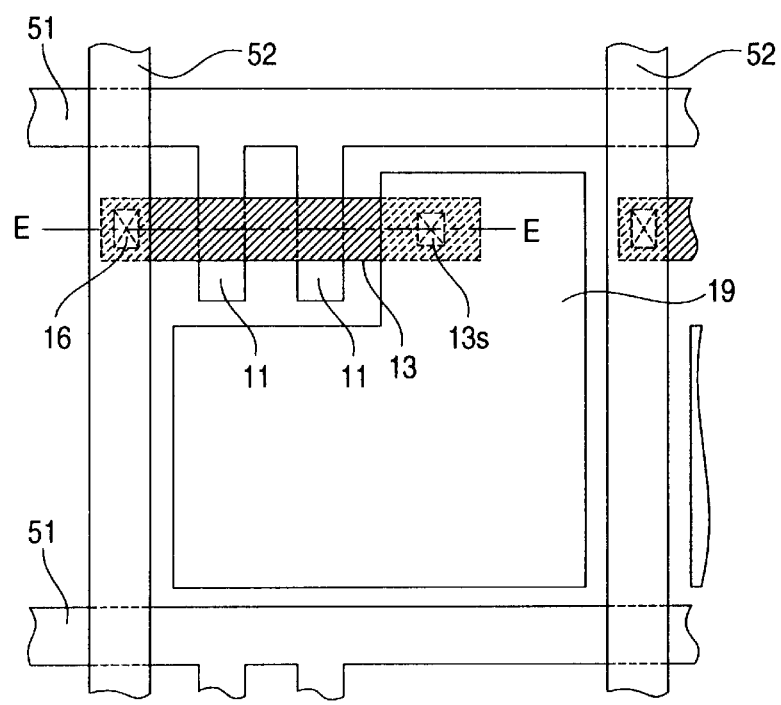
FIG. 8 is a plan view of an LCD of the conventional art.
Figure 9:
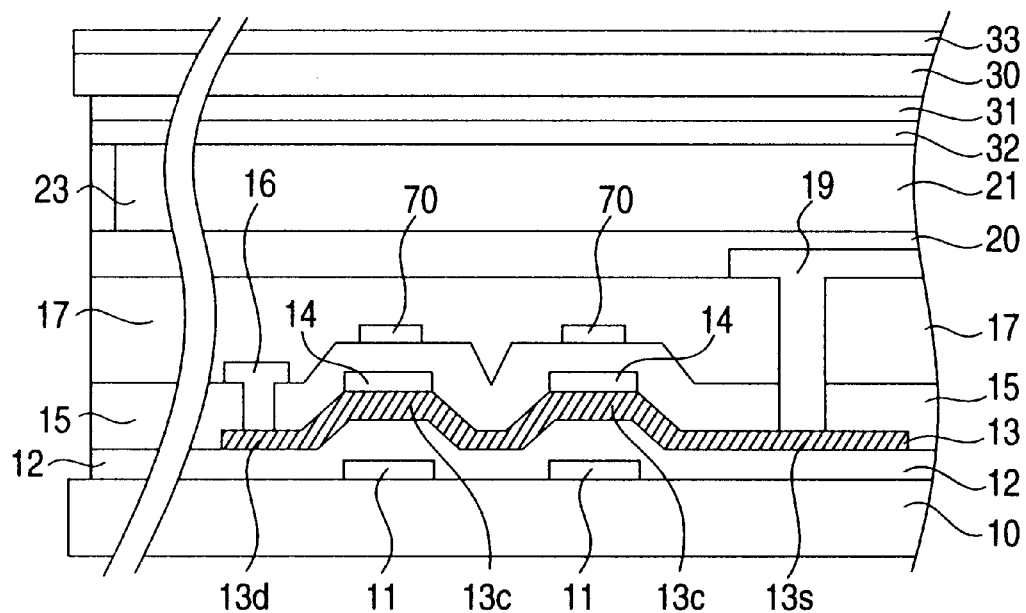
FIG. 9 is a section view of the LCD of the conventional art.
Figure 10:
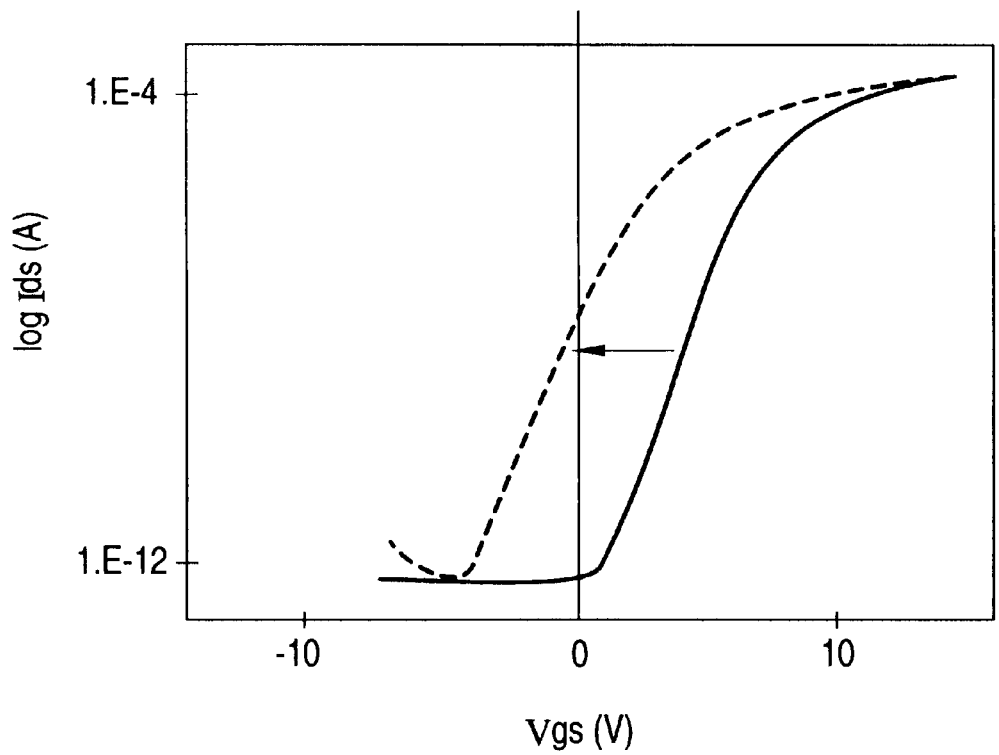
FIG. 10 is a characteristic diagram showing characteristics of a TFT.

In the embodiment, the second gate electrodes 70 are disposed on the interlayer insulating film 15, and smaller in width than the channels 13c and the gate electrodes 11, and the edges of the second gate electrodes 70 are not overlapped with those of the channels 13c and the gate electrodes 11. Alternatively, as shown in FIG. 7A, the second electrodes 70 may be large in width than the gate electrodes 11, and, as shown in FIG. 7B, a single second gate electrode 70 may cover both the first gate electrodes 11 constituting the double gate structure.

In the so-called double gate structure having the two first gate electrodes 11, the single second gate electrode 70 may be disposed only one of the first gate electrodes 11.

Alternatively, the second gate electrodes 70 may be disposed on the planarizing insulating film 17 in place of the interlayer insulating film 15. Also in the alternative, it is possible to attain the same effects as those in the case where the second gate electrodes are disposed on the interlayer insulating film 15.

The insulating films which are disposed between the second gate electrodes 70 and the active layer 13, for example, the stopper insulating film 14, the interlayer insulating film 15, and the planarizing insulating film 17 in the embodiment may be configured by a single member of an SiO film, an SiN film, or an organic film, or by a laminated member in which such films are laminated.

<Second Embodiment>

Figure 4:
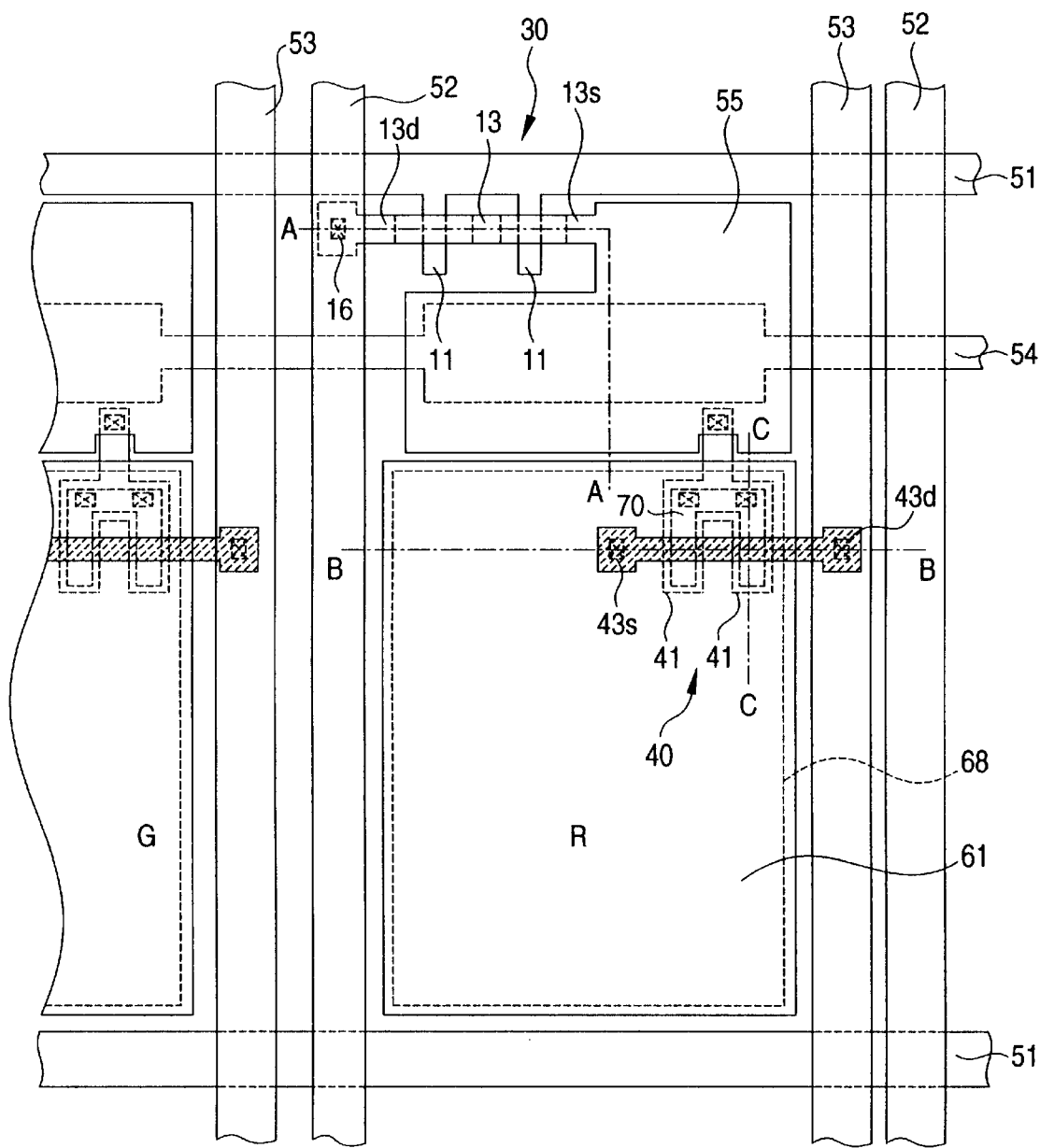
FIG. 4 is a plan view of an organic EL of a second embodiment of the invention.
Figure 5:
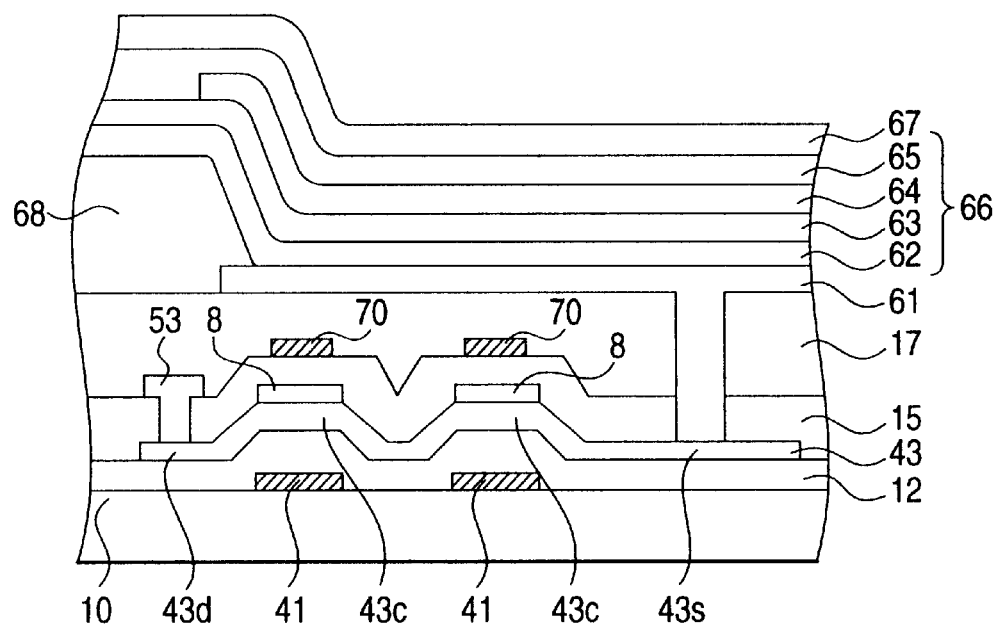
FIG. 5 is a section view of the organic EL of the second embodiment of the invention.
Figure 6:
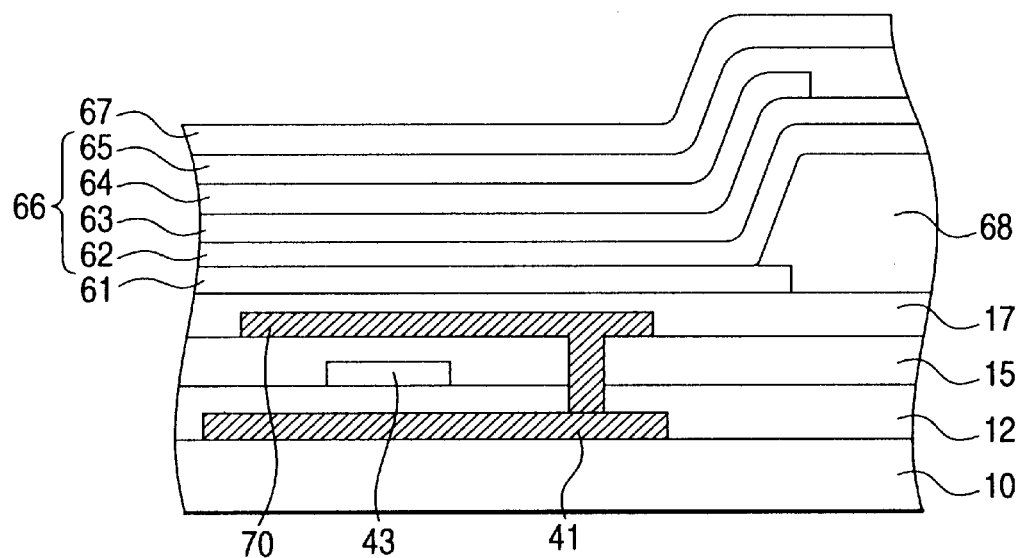
FIG. 6 is a section view of the organic EL of the second embodiment of the invention.

FIG. 4 is a plan view showing one display pixel in the case where the invention is applied to an organic EL display device, FIG. 5 is a section view taken along the line B—B of FIG. 4, and FIG. 6 is a section view taken along the line C—C of FIG. 4.

As shown in FIG. 4, a display pixel is formed in a region surrounded by a gate signal line 51 and a drain signal line 52. A first TFT 30 is disposed in the vicinity of an intersection of the signal lines. The source 13s of the TFT 30 serves also as a capacitance electrode which cooperates with a holding capacitance electrode line 54 to constitute a capacitance, and is connected to the gates 41 of a second TFT 40. The source 43s of the second TFT is connected to the anode 61 of an organic EL element 60, and the drain 43d is connected to a driving power source line 53 for driving the organic EL element.

In the vicinity of the TFT, the holding capacitance electrode line 54 elongates in parallel with the gate signal line 51. The holding capacitance electrode line 54 is made of chromium and the like, and cooperates via a gate insulating film 12 with the capacitance electrode 55 connected to the source 13s of the TFT, to accumulate charges, thereby constituting a capacitance. The holding capacitance is disposed in order to hold a voltage applied to the gate electrodes 41 of the second TFT 40.

Display electrodes each of which comprises the organic EL element 60 and the TFTs 30 and 40 as described above are arranged in a matrix form on a substrate 10, thereby forming an organic EL display device.

As shown in FIGS. 5 and 6, the organic EL display device is configured by sequentially forming in a laminated manner the TFTs and the organic EL element on the substrate 10 such as a substrate made of glass or a synthetic resin, an electrically conductive substrate, or a semiconductor substrate. In the case where an electrically conductive substrate or a semiconductor substrate is used as the substrate 10, the TFTs and the organic EL element are formed after an insulating film of $SiO_2$, SiN, or the like is formed on the substrate 10.

In the embodiment, both the first and second TFTs 30 and 40 are of the so-called bottom gate type in which the gate electrode is disposed below the active layer 13, and a poly-silicon (hereinafter, referred to as "p-Si") film is used as the active layer. In the TFTs, the gate electrodes 11 and 41 have the double gate structure.

First, the first TFT 30 which is a TFT for switching will be described.

As shown in FIG. 4, the gate signal line 51 which is made of a refractory metal such as chromium (Cr) or molybdenum (Mo) and which serves also as the gate electrodes 11, and the drain signal line 52 made of Al are formed on the insulative substrate 10 which is made of quartz glass, non-alkali glass, or the like. The driving power source line 53 which is a driving source of the organic EL element and which is made of Al is disposed.

Thereafter, the gate insulating film 42, and the active layer 43 configured by a p-Si film are sequentially formed. The active layer 43 has a so-called LDD (Lightly Doped Drain) structure. The source 43s and the drain 43d are formed outside the structure.

An interlayer insulating film 15 in which an $SiO_2$ film, an SiN film, and an $SiO_2$ film are laminated in this sequence is formed over the whole face of the gate insulating film 42, the active layer 43, and the stopper insulating film 14. A drain electrode 16 is formed by filling a metal such as Al into a contact hole which is opened correspondingly with the drain 13d. A planarizing insulating film 17 which is made of an organic resin or the like and which planarizes the surface is formed over the whole face.

Next, the second TFT which is a TFT for driving the organic EL element 60 will be described.

As shown in FIG. 6, the gate electrodes 41 made of a refractory metal such as Cr or Mo are formed on the insulative substrate 10 which is made of quartz glass, non-alkali glass, or the like.

The gate insulating film 12, and the active layer 43 configured by a p-Si film are sequentially formed.

In the active layer 43, channels 43c which are intrinsic or substantially intrinsic are disposed above the gate electrodes 41, and the source 43s and the drain 43d are formed on both sides of the channels 43c by ion doping.

The interlayer insulating film 15 in which an $SiO_2$ film, an SiN film, and an $SiO_2$ film are laminated in this sequence is formed over the whole face of the gate insulating film 12 and the active layer 43. The driving power source line 53 connected to a driving power source 50 is formed by filling a metal such as Al into a contact hole which is opened correspondingly with the drain 43d. At the same time, the second gate electrode 70 is formed on the interlayer insulating film 15 and above channels 43c. In the planarizing insulating film 17, a contact hole is opened at a position corresponding to the drain 43d. The driving power source line 53 which is connected to the driving power source line 53 via the contact hole and which is made of Al is formed. At this time, a part of the driving power source line 53 is extended over the channels 43c to form a conductor 56. In the planarizing insulating film 17, a contact hole is opened at a position corresponding to the source 43s, and a transparent electrode which is contacted with the source 43s via the contact hole, and which is made of ITO, i.e., the anode 61 of the organic EL element is formed on the planarizing insulating film 17.

The organic EL element 60 has a structure in which the anode 61 configured by a transparent electrode of ITO or the like, a light emitting element layer 66 consisting of: a first hole transporting layer 62 made of MTDATA (4,4-bis(3-methylphenylphenylamino)biphenyl); a second hole transporting layer 63 made of TPD (4,4,4-tris(3-methylphenylphenylamino)triphenylanine); a luminescent layer 64 made of Bebq2 (10-benzo[h]quinolinol-beryllium complex) containing a quinacridone derivative; and an electron transporting layer65 made of Bebq2, and a cathode 67 made of a magnesium/indium alloy are laminated in this sequence. The cathode 67 is formed on the whole face of the substrate 10 constituting the organic EL display device shown in FIG. 4, i.e., the whole face of the sheet. Further as shown in FIG. 4, insulating film 68 for planarizing a surface is formed in a state that edge (as shown as a dotted line) of the insulating film 68 is located inside of the edge of the anode 61 so as to prevent the anode 61 from short-circuiting with the cathode 67.

In the organic EL element, holes injected through the anode, and electrons injected through the cathode are recombined with each other inside the luminescent layer to excite organic molecules constituting the luminescent layer, thereby generating excitons. In a radiative decaying process of the excitons, light is generated from the luminescent layer. The light is emitted from the transparent anode via the transparent insulative substrate to the outside, thereby causing the element to perform light emission. When the luminescent layer of each organic EL element is made of a material emitting either of red (R), green (G), and blue (B), the element can emit light of the respective color.

Since the second gate electrodes 70 are formed above the channels 43c of the second TFT 40 as described above, it is possible to suppress back channels which may be caused by an electric field due to the voltage applied to the cathode 67. Namely, the TFT is not affected by variations of the electric field due to the potential of the cathode, and the characteristics and thicknesses of the films above the channels, and can maintain the original characteristics. Therefore, an uneven display which may be caused by, for example, variations of the electric field due to the potential of the cathode, and the characteristics and thicknesses of the films above the channels can be prevented from occurring.

When the anode 61 is elongated to extend above the second TFT, the substantial area of the light emitting region, i.e., the aperture ratio can be improved.

In the embodiment, the second gate electrodes 70 are disposed on the interlayer insulating film 15, and smaller in width than the channels 13c and the gate electrodes 11, and the edges of the second gate electrodes 70 are not overlapped with those of the channels 13c and the gate electrodes 11. Alternatively, as shown in FIG. 7A, the second electrodes 70 may be large in width than the gate electrodes 11, and, as shown in FIG. 7B, a single second gate electrode 70 may cover both the first gate electrodes 11 constituting the double gate structure.

In the so-called double gate structure having the two first gate electrodes 11, the single second gate electrode 70 may be disposed only one of the first gate electrodes 11.

Alternatively, the second gate electrodes 70 may be disposed on the planarizing insulating film 17 in place of the interlayer insulating film 15. Also in the alternative, it is possible to attain the same effects as those in the case where the second gate electrodes are disposed on the interlayer insulating film 15.

The insulating films which are disposed between the second gate electrodes 70 and the active layer 13, for example, the stopper insulating film 14, the interlayer insulating film 15, and the planarizing insulating film 17 in the embodiment may be configured by a single member of an SiO film, an SiN film, or an organic film, or by a laminated member in which such films are laminated.

In the second embodiment, a first TFT also preferably has a second gate electrode.

Further the second gate electrodes 70 is not limited to be connected with the first gate electrode, the second gate electrodes 70 can be connected with another appropriate potential independent on a potential of the first gate electrode.

Although it is preferable that the second gate electrode is connected with power line of grand line, new power line is required to connect the second gate electrode with the power line and an aperture ratio is lowered. Therefore the second gate electrode is connected with the first gate electrode.

According to the invention, a display device in which variations of characteristics of a TFT are eliminated and the aperture ratio is improved can be obtained.

What is claimed is:

1. A display device in which a thin film transistor is disposed on an insulative substrate, said thin film transistor comprising:
   a first gate electrode; a gate insulating film; a semiconductor film which is formed on said gate insulating film and which has a channel;
   a insulating film;
   a display electrode connected to a source which is formed in said semiconductor film, said display electrode being elongated so as to extend above said channel of said thin film transistor,
      wherein a second gate electrode formed between said first gate electrode and said display electrode;
   a light emitting layer formed on said display electrode, wherein said display electrode is an electrode used in an organic electro luminescent device; and
   at least one pixel,
      wherein each pixel comprises the thin transistor and a second thin film transistor,
      wherein the display electrode is extended above the thin film transistor but not extended above said second thin film transistor.

2. A display device according to claim 1, wherein said channel is covered with a stopper insulating film.

3. A display device according to claim 2, wherein said stopper insulating film is made of an $SiO_2$ film.

4. A display device according to claim 2, wherein said stopper insulating film is made of a two-layered film of SiN and organic film.

5. A display device according to claim 1, wherein said first gate electrode is a double gate structured electrode divided above the channel.

6. A display device according to claim 5, wherein said second gate electrode is a double gate structured electrode divided corresponding to said first gate electrode.

7. A display device according to claim 1, wherein said display electrode is a reflective display electrode which is made of a reflective material.

8. A display device according to claim 7, wherein said reflective display electrode is made of Al—Nd alloy.

9. The display device according to claim 1, further comprising an electrode connected to the gate electrode, wherein the electrode connected to the gate electrode is provided between the display electrode and the thin film transistor but not provided on or under the second thin film transistor.

10. A display device in which a thin film transistor is disposed on an insulative substrate, said thin film transistor comprising:
a first gate electrode; a gate insulating film; a semiconductor film which is formed on said gate insulating film and which has a channel;
a insulating film;
a display electrode connected to a source which is formed in said semiconductor film, said display electrode being elongated so as to extend above said channel of said thin film transistor,
wherein a second gate electrode formed between said first gate electrode and said display electrode, and wherein said second gate electrode is connected with said first gate electrode;
a light emitting layer formed on said display electrode, wherein said display electrode is an electrode used in an organic electro luminescent device; and
at least one pixel;
wherein each pixel comprises the thin film transistor and a second thin film transistor,
wherein the display electrode is extended above the thin film transistor bat not extended above said second thin film transistor.

11. A display device according to claim 10, wherein said second gate electrode is formed so as to be faced with said first gate electrode through said insulating film.

12. A display device according to claim 11, wherein said display electrode is rectangular.

13. The display device according to claim 10, further comprising an electrode connected to the gate electrode, wherein the electrode connected to the gate electrode is provided between the display electrode and the thin film transistor but not provided on or under and the second thin film transistor.

14. A display device in which a thin film transistor is disposed on an insulative substrate, said thin film transistor comprising:
a first gate electrode; a gate insulating film; a semiconductor film which is formed on said gate insulating film and which has a channel;
a insulating film;
a display electrode connected to a source which is formed in said semiconductor film, said display electrode being elongated so as to extend above said channel of said thin film transistor,
wherein a second gate electrode formed between said first gate electrode and said display electrode, and wherein said display electrode is an electrode used in an organic electro luminescent device;
a light emitting layer formed on said display electrode; and
at least one pixel,
wherein each pixel comprises the thin film transistor and a second thin film transistor,
wherein the display electrode is extended above the thin film transistor but not extended above said second thin film transistor but not extended above the said second thin film transistor.

15. The display device according to claim 14, further comprising an electrode connected to the gate electrode, wherein the electrode connected to the gate electrode is provided between the display electrode and the thin film transistor but not provided on or under the second thin film transistor.

16. A display device comprising:
an insulative substrate;
a thin film transistor including ante electrode, a gate insulating film and a channel region;
a display electrode connected to one of a source region of the thin film transistor and a drain region of the thin film transistor, said display electrode being extended above the channel region of the thin film transistor;
and electrode provided between the channel region of the thin film transistor and the display electrode,
wherein the electrode is connected to the gate electrode;
a light emitting layer formed on said display electrode, wherein said display electrode is an electrode used in an organic electro luminescent device; and
at least one pixel,
wherein each pixel comprises the thin film transistor and a second thin film transistor,
wherein the display electrode is extended above the thin film transistor but not extended above said second thin film transistor.

17. The display device according to claim 16, wherein the display electrode is a reflective display electrode made of a reflective material.

18. The display device according to claim 16, wherein the electrode connected to the gate electrode is provided between the display electrode and the thin film transistor but not provided on or under the second thin film transistor.

19. A display device comprising:
an insulative substrate;
a thin film transistor including a gate electrode, a gate insulating film and a channel region;
a display electrode connected to one of a source region of the thin film transistor and a drain region of the thin film transistor, said display electrode being extended above the channel region of the thin film transistor;
an electrode provided between the channel region of the thin film transistor and the display electrode,
wherein a gate voltage is applied to the electrode;
a light emitting layer formed on said display electrode, wherein said display electrode is an electrode used in an organic electro luminescent device; and
at least one pixel,
wherein each pixel comprises the thin film transistor and a second thin film transistor,
wherein the display electrode is extended above the thin film transistor but not extended above said second thin film transistor.

20. The display device according to claim 19, wherein the display electrode is a reflective display electrode made of a reflective material.

21. The display device according to claim 19, wherein the electrode connected to the gate electrode is provided between the display electrode and the thin film transistor but not provided on or under the second thin film transistor.

22. A display device comprising:
an insulative substrate;
a thin film transistor including a gate electrode, a gate insulating film and a channel region;
a display electrode connected to one of a source region of the thin film transistor and a drain region of the thin film transistor, said display electrode being extended above the channel region of the thin film transistor;

an electrode provided between the channel region of the thin film transistor and the display electrode, wherein a voltage different from a display electrode voltage is applied to the electrode; and a light emitting layer formed on said display electrode, wherein said display electrode is an electrode used in an organic electro luminescent device; and at least one pixel, wherein each pixel comprises the thin film transistor and a second tin film transistor, wherein to display electrode is extended above the tin film transistor but not extended above said second thin film transistor.

23. The display device according to claim 22, wherein the display electrode is a reflective display electrode made of a reflective material.

24. The display device according to claim 22, wherein the electrode connected to the gate electrode is provided between the display electrode and the thin film transistor but not provided between the display electrode and the second thin film transistor.

* * * * *